US009287891B1

(12) United States Patent
Lee et al.

(10) Patent No.: US 9,287,891 B1
(45) Date of Patent: Mar. 15, 2016

(54) SUCCESSIVE APPROXIMATION REGISTER ANALOG TO DIGITAL CONVERTERS

(71) Applicant: MediaTek Inc., Hsin-Chu (TW)

(72) Inventors: Zwei-Mei Lee, Taoyuan (TW); Chun-Cheng Liu, Xianxi Township, Changhua County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/693,183

(22) Filed: Apr. 22, 2015

Related U.S. Application Data

(60) Provisional application No. 62/105,418, filed on Jan. 20, 2015.

(51) Int. Cl.
| | |
|---|---|
| *H03M 1/38* | (2006.01) |
| *H03M 1/46* | (2006.01) |
| *H03M 1/40* | (2006.01) |
| *H03M 1/10* | (2006.01) |

(52) U.S. Cl.
CPC .......... *H03M 1/468* (2013.01); *H03M 1/1009* (2013.01); *H03M 1/38* (2013.01); *H03M 1/40* (2013.01); *H03M 1/403* (2013.01)

(58) Field of Classification Search
CPC ....... H03M 1/442; H03M 1/38; H03M 1/403; H03M 1/40; H03M 1/468
USPC ........................................ 341/161, 155, 120
See application file for complete search history.

(56) References Cited

U.S. PATENT DOCUMENTS

| | | | | |
|---|---|---|---|---|
| 8,451,151 B2* | 5/2013 | Lin | ...................... | H03M 1/1061 341/110 |
| 8,477,058 B2* | 7/2013 | Chang | ................... | H03M 1/462 341/141 |
| 8,842,027 B2* | 9/2014 | Huang | ................ | H03M 1/1057 341/120 |
| 8,907,826 B2* | 12/2014 | Hong | .................. | H03M 1/1071 341/118 |
| 8,981,973 B2* | 3/2015 | Kumar | ................ | H03M 1/0617 341/118 |

OTHER PUBLICATIONS

Liu, W., et al.; "An Equalization-Based Adaptive Digital Background Calibration Technique for Successive Approximation Analog-to Digital Converters;" IEEE; 2007; pp. 289-292.
Liu, W., et al.; "A 12b 22.5/45MS/s3.0mW0.059mm2 CMOS SAR ADC Achieving Over 90dB SFDR;" ISSCC 2010; Session 21; Successive-Approximation ADCs; 212; Feb. 2010; pp. 1-3.

* cited by examiner

*Primary Examiner* — Brian Young
(74) *Attorney, Agent, or Firm* — McClure, Qualey & Rodack, LLP

(57) ABSTRACT

A SAR ADC is provided. A DAC provides an intermediate analog signal according to an analog input signal, a most significant bit capacitance and a plurality of significant bit capacitances smaller than the most significant bit capacitance. A first switched capacitor array selectively provides the most significant bit capacitance or the significant bit capacitances according to a select signal. Sum of the significant bit capacitances is equal to the most significant bit capacitance. The second switched capacitor array provides the significant bit capacitances when the first switched capacitor array provides the most significant bit capacitance, and provides the most significant bit capacitance when the first switched capacitor array provides the significant bit capacitances. A comparator provides a comparison result according to the intermediate analog signal. A SAR logic provides an digital output signal according to the comparison result.

16 Claims, 6 Drawing Sheets

SUCCESSIVE APPROXIMATION REGISTER ANALOG TO DIGITAL CONVERTERS

CROSS REFERENCE TO RELATED APPLICATIONS

This application claims the benefit of U.S. Provisional Application No. 62/105,418, filed on Jan. 20, 2015, the contents of which are incorporated herein by reference.

BACKGROUND OF THE INVENTION

1. Field of the Invention

The invention relates to an analog to digital converter (ADC), and more particularly to an ADC that uses successive approximation techniques.

2. Description of the Related Art

Analog to digital converters (ADCs) are widely used in a variety of applications, such as medical systems, audio systems, test and measurement equipment, communication systems, and image and video systems, etc. The most common ADC construction comprises flash ADCs, pipeline ADCs and successive approximation register (SAR) ADCs. The power consumption of the SAR ADC is smaller than the flash ADC and the pipeline ADC. Thus the systems with limited power supply, such as portable devices, usually use SAR ADCs.

The conversion accuracy of the SAR ADCs is mainly subject to the DAC mismatch and offset errors. Particularly, for the switched-capacitor SAR ADCs, the capacitor mismatch is the dominant one.

BRIEF SUMMARY OF THE INVENTION

Thus, it is desired to provide a successive approximation register circuit which can correct error caused by the capacitor mismatch.

An exemplary embodiment of a successive approximation register (SAR) analog to digital converter (ADC) circuit is provided. The SAR ADC circuit receives an analog input signal and operates in a sample phase and a conversion phase following the sample phase to generate a digital output signal. The SAR ADC circuit comprises a plurality of capacitors, a comparator, and a logic unit. The plurality of capacitors are coupled to a summing node. Before the conversion phase, a target capacitor among the plurality of capacitors is coupled to a direct current (DC) voltage and the other capacitors among the plurality of capacitors are coupled to the analog input signal. The comparator has an input terminal coupled to the summing node. In the conversion phase, the comparator performs a comparison operation to a summing voltage at the summing node The logic unit has a plurality of weighting values corresponding to the plurality of capacitors respectively and generates the digital output signal according to the weighting values and a comparison result of the comparison operation. The DC voltage has a first voltage level or a second voltage level different from the first voltage level according to a random sequence. The weighting value of the target capacitor is calibrated according to the digital output signal and the random sequence.

An exemplary embodiment of a successive approximation register (SAR) analog to digital converter (ADC) circuit is provided. The SAR ADC circuit receives an analog input signal and operates in a sample phase and a conversion phase following the sample phase to generate a digital output signal. The SAR ADC circuit comprises a first switch, a plurality of capacitors, a plurality of second switches, a plurality of switch circuits, a comparator, a logic unit, and an extraction and compensation unit. The first switch is coupled between a first voltage and a summing node. Each capacitor has a first terminal coupled to the summing node and further has a second terminal. Each second switch is coupled between the second terminal of one of the plurality of capacitors and a second voltage. The plurality of switch circuits receives the analog input signal, Each switch circuits is coupled to the second terminal of one of the plurality of capacitors and, before the conversion phase, provides a DC voltage or the analog input signal to the corresponding capacitor. The comparator has an input terminal coupled to the summing node. In the conversion phase, the comparator performs a comparison operation to a summing voltage at the summing node. The logic unit has a plurality of weighting values corresponding to the plurality of capacitors respectively and generates the digital output signal according to the weighting values and a comparison result of the comparison operation. The extraction and compensation unit receives the digital output signal. When a target capacitor among the plurality of switch circuits receive the DC voltage from the corresponding switch circuit, the DC voltage has a first voltage level or a second voltage level different from the first voltage level based on a random sequence,. The extraction and compensation unit obtains a calibrated weighting value according to the digital output signal and the random sequence, and the calibrated weighting value serves as the weighting value of the target capacitor.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
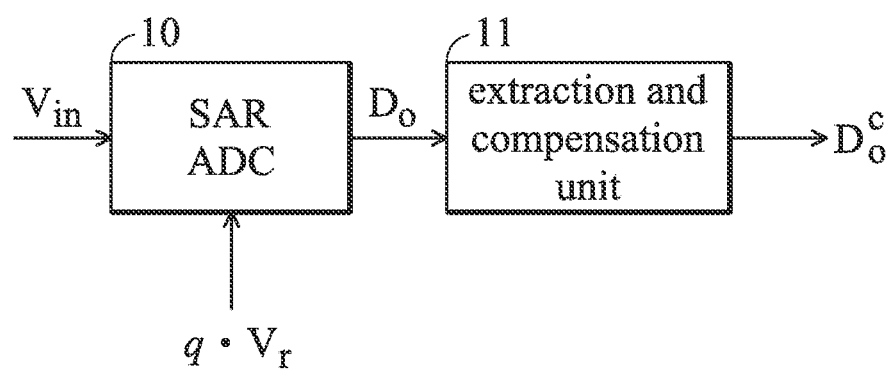
FIG. 1 shows an exemplary embodiment of a successive approximation register (SAR) analog to digital converter (ADC) circuit.
Figure 2:
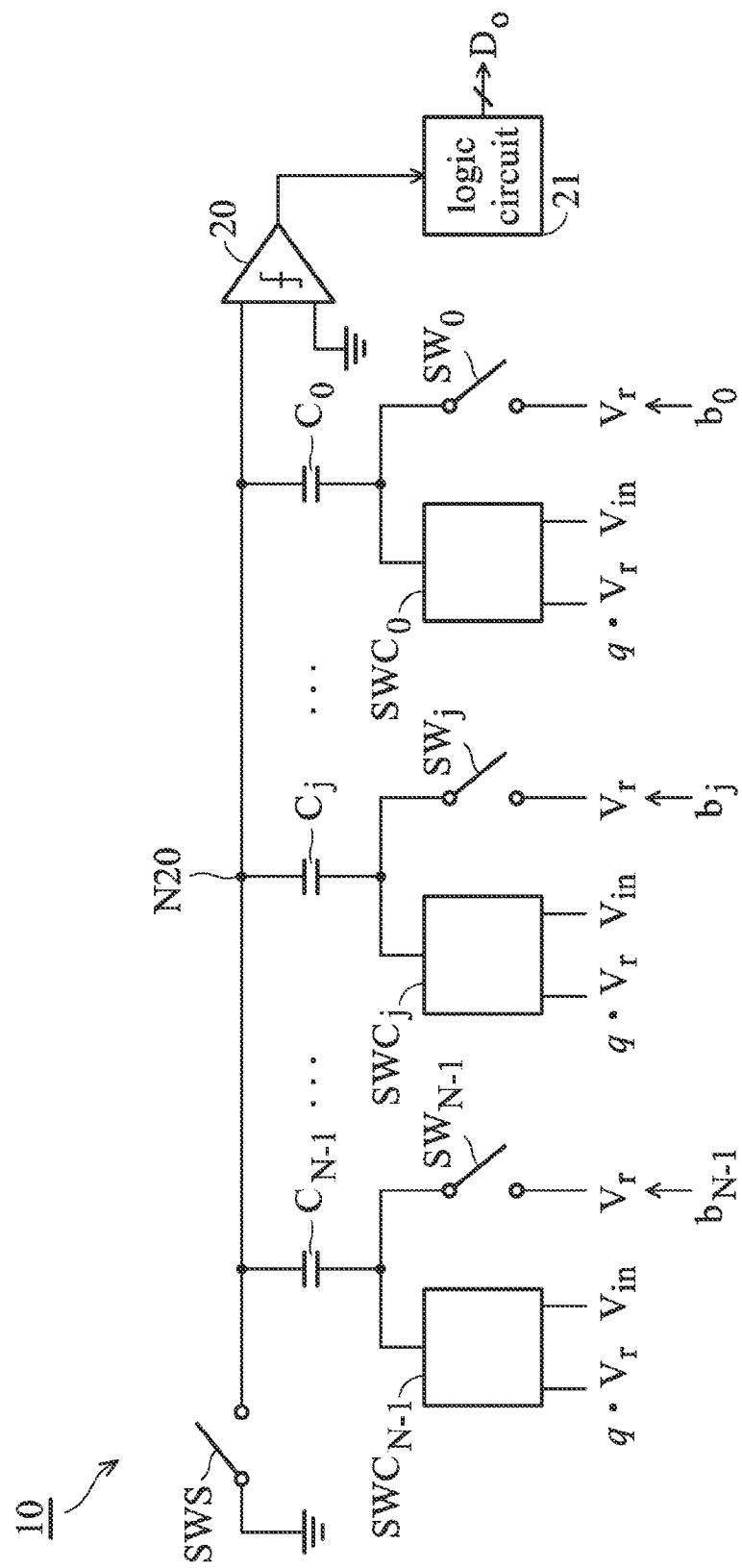
FIG. 2 shows an exemplary embodiment of an SAR DAC of the SAR ADC circuit in FIG. 1.

FIG. 1 shows an exemplary embodiment of a successive approximation register (SAR) analog to digital converter (ADC) circuit. As shown in FIG. 1 an SAR ADC circuit 1 comprises an SAR DAC 10, and an extraction and compensation unit 11. The SAR ADC circuit 1 operates in a sample phase and a conversion phase following the sample phase in several cycles. The SAR ADC 10 receives an analog input signal $V_{in}$ and generates a digital output signal $D_o$ according to the analog input signal $V_{in}$, weighting values of capacitors (shown in FIG. 2), a direct current (DC) voltage, and a random signal $q \cdot V_r$, wherein q represents is a binary value random sequence which is uncorrelated with the analog input signal $V_{in}$, and each value of the random sequence is equal to 1 or −1. Thus, the voltage level of the random signal $q \cdot V_r$ is the level of $-V_r$ or $V_r$. In the embodiment, the random signal $q \cdot V_r$ is injected to at least one capacitor (shown in FIG. 2) to be calibrated in the SAR ADC 10. Thus, the digital output signal $D_o$ comprises one term related to the random signal $q \cdot V_r$. The extraction and compensation unit 11 extracts the real weighting value of the capacitor to be calibrated according to the digital output signal $D_o$ and the random signal $q \cdot V_r$. Then, the extraction and compensation unit 11 corrects the digital output signal $D_o$ based on the real weighting value of the capacitor to be calibrated The detailed structure of the SAR DAC 10 is shown in FIG. 2. As shown in FIG. 2, the SAR DAC 10 comprises N capacitors $C_0 \sim C_{N-1}$, a sample switch SWS, N switches $SW_0 \sim SW_{N-1}$, N switch circuits $SWC_0 \sim SWC_{N-1}$, a comparator 20, and a logic unit 21, wherein N is an positive integer. The sample switch SWS is coupled to a summing node N20 and a signal. In the embodiment, the signal which is coupled to the sample switch SWS is a ground voltage GND. One terminal of the comparator 20 is coupled to the summing node N20, and the other terminal thereof is coupled to the ground voltage GND. Each of the capacitors $C_0 \sim C_{N-1}$ has two terminals. A first terminal of each capacitor is coupled to the summing node N20. In the embodiment, a second terminal of each capacitor is coupled to one switch $SW_j$ and one switch circuit $SWC_j$, wherein $0 \leq j \leq N-1$. For example, the other terminal of the capacitor $C_{N-1}$ is coupled to the switch $SW_{N-1}$ and the switch circuit $SWC_{N-1}$, and the other terminal of the capacitor $C_0$ is coupled to the switch $SW_0$ and the switch circuit $SWC_0$. The sample switch SWS, the N switches $SW_0 \sim SW_{N-1}$, and the N switch circuits $SWC_0 \sim SWC_{N-1}$ are controlled by the logic unit 21.

Figure 3:
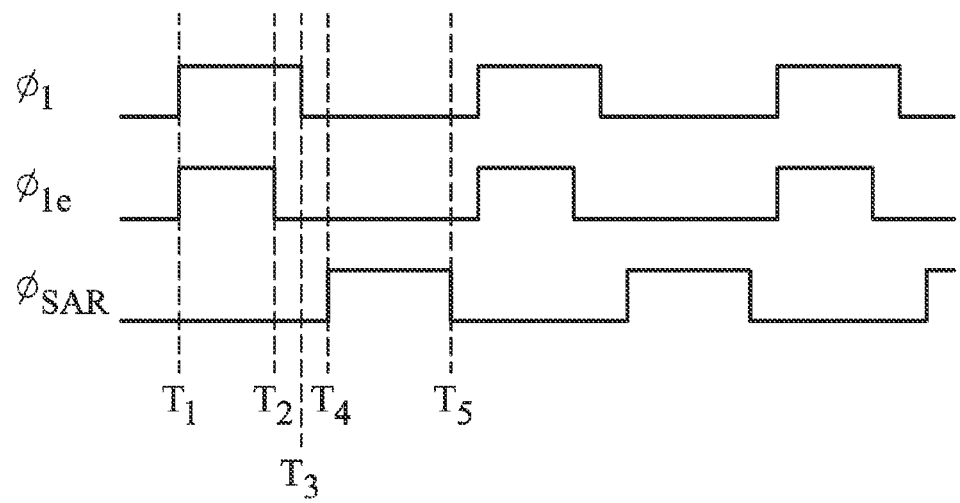
FIG. 3 shows timing of a sample phase and a conversion phase of the SAR ADC circuit in FIG. 1.

The each of the switch circuits $SWC_0 \sim SWC_{N-1}$ receives the analog input signal $V_{in}$ and the random signal $q \cdot V_r$. Each switch circuit is controlled by the logic unit 21 to provide the analog input signal $V_{in}$ or a DC voltage to the corresponding capacitor. The level of the DC voltage is determined by the random signal $q \cdot V_r$, that is the level of the DC voltage is the level of $-V_r$ or $V_r$. FIG. 3 shows the timing of the sample phase and the conversion phase of the SAR ADC circuit 10 In FIG. 3, $\phi_{1e}$ represents the timing of the sample phase, $\phi_{SAR}$ represents the timing of the conversion phase, and $\phi_1$ represents the timing of the operation of the switch circuits. In the sample phase between a time point T1 and a time point T2, the sample switch SWS is turned on. In the case, it is desired to calibrate the weighting value of one capacitor $C_j$ (also referred to as "target capacitor") of the capacitor $C_0 \sim C_{N-1}$, before the occurrence of the conversion phase (that is before the time point T4), the corresponding switch circuit $SWC_j$ provides the DC voltage to the one capacitor $C_j$, and the other switch circuits provide the analog input signal $V_{in}$ to the corresponding capacitors. At the sampling time, the charge stored at the summing node N20 is equal to:

$$Q_{x,1}^c = -V_{in} \times C_{tot} + V_{in} \times C_j - q \cdot V_r \times C_j \tag{1}$$

where $C_{tot} = \Sigma_{i=0}^{N-1} C_i$.

In the conversion phase between the time point T4 and a time point T5, the switches $SW_{N-1} \sim SW_0$ are sequentially turned on to provide the voltage Vr to the respective capacitors $SW_{N-1} \sim SW_0$. The comparator 20 determines the binary code word from MSB $b_{N-1}$ to the LSB $b_0$ by examining the polarity of the voltage at the summing node N20 sequentially.

At the end of the conversion phase, the charged stored at the summing node N20 is given by:

$$Q_{x,2} = \sum_{i=0}^{N-1} (V_x - b_i \cdot V_r) \times C_i \tag{2}$$

where $V_x$ represents the voltage at the summing node N20.

According to the charge conservation at the summing node N20, $Q_{x,1}^C$ is equal to $Q_{x,2}$, and the voltage at the summing node N20 is express as:

$$V_x = -V_{in} + V_{in} \times \frac{C_j}{C_{tot}} - q \cdot V_r \times \frac{C_j}{C_{tot}} + \sum_{i=0}^{N-1} b_i \cdot V_r \times \frac{C_i}{C_{tot}} \tag{3}$$

Ideally, since the voltage $V_x$ approaches zero at the end of the conversion phase, $D_o = [b_{N-1}, b_{N-2}, \ldots b_0]$ is the best quantized representation of the analog input signal $V_{in}$, and the corresponding digital value of the digital output signal $D_o$ is given by:

$$D_o \approx V_{in} - V_{in} \times \frac{C_j}{C_{tot}} + q \cdot V_r \times \frac{C_j}{C_{tot}} = S + q \cdot R_j \tag{4}$$

where $S = V_{in} - V_{in} \times (C_j/C_{tot})$ and $R_j = V_r \times (C_j/C_{tot})$.

Figure 4:
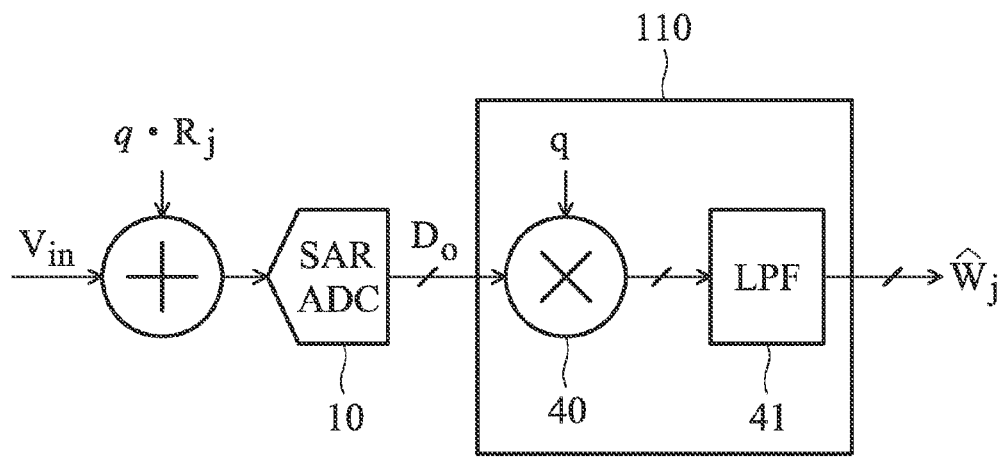
FIG. 4 shows an exemplary embodiment of an extraction and compensation unit of the SAR ADC circuit in FIG. 1.

According to the above description, the weighting value of capacitor $C_j$ is desired to be calibrated. As shown in Equation (4), the $R_j = V_r \times (C_j/C_{tot})$ represents the weighting value of capacitor $C_j$ and determines the real weighting value of the capacitor $C_j$. In order to extract the parameter $R_j$, the extraction and compensation unit 11 performs a correlation operation to the digital output signal $D_o$ with the random sequence q and further performs a low-pass-filtering operation to the digital output signal $D_o$ to generate a calibrated weighting value $\hat{W}_j$ of the capacitor $C_j$. In other words, the digital output signal $D_o$ is correlated with the random sequence q and then low-pass filtered to obtain the weighting value $\hat{W}_j$. The extraction and compensation unit 11 then corrects the digital output signal $D_o$ according to the calibrated weighting value $\hat{W}_j$ to generate the output signal $D_o^C$ FIG. 4 shows an exemplary embodiment of an extraction circuit 110 in the extraction and compensation unit 11. For detailed illustration, FIG. 4 also shows the SAR DAC 10. As shown in FIG. 4, the extraction circuit 11 comprises a multiplier 40 and a low-pass filter (LPF) 41. The multiplier 40 receives the digital output signal $D_o$ and the random sequence q to achieve the correlation operation to the digital output signal $D_o$ and the random sequence q. The low-pass filter 41 is coupled to the multiplier 40 and performs the low-pass-filtering operation to the digital output signal $D_o$ to generate the calibrated weighting value $\hat{W}_j$. According to the operations of the multiplier 40 and the low-pass filter 41, the term $R_j$ is retained, and the calibrated weighting value $\hat{W}_j$ is the digital expression of the term $R_j$. Thus, the calibrated weighting value $\hat{W}_j$ related to the real weighting value of the capacitor $C_j$ is obtained and used to correct the digital output signal $D_o$.

Finally, the digital output signal $D_o$ is corrected, and the corrected output signal is represented by:

$$D_o^c = \sum_{i=0}^{j-1} b_i \cdot W_i + b_j \cdot \hat{W}_j + \sum_{i=j+1}^{N-1} b_i \cdot W_i \quad (5)$$

If several weighting values of the capacitors required to be calibrated, the above operations performed to obtain the calibrated weighting value $\hat{W}_j$ related to the real weighting value of the capacitor $C_j$ are also performed for the other capacitors required to be calibrated. The related description is omitted. For example, in the case where it is desired to calibrate the weighting values of the capacitors $C_0 \sim C_j$ among the capacitor $C_0 \sim C_{N-1}$, the corresponding calibrated weighting values $\hat{W}_0 \sim \hat{W}_j$ the corrected output signal is represented by:

$$D_o^c = \sum_{i=0}^{j} b_i \cdot \hat{W}_i + \sum_{i=j+1}^{N-1} b_i \cdot W_i \quad (6)$$

According to Equation (5) and Equation (6), the weighting values of the capacitors can be calibrated. Even though the capacitor mismatch occurs, the digital output signal $D_o$ can more approach the accurate digital value of the analog input signal $V_{in}$.

Figure 5:
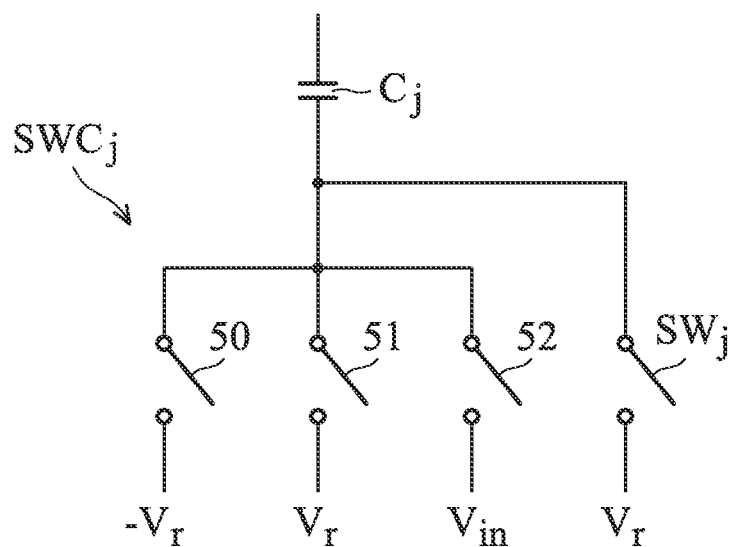
FIG. 5 shows an exemplary embodiment of switch circuits of the SAR ADC in FIG. 2.

FIG. 5 shows an exemplary embodiment of the switch circuits $SWC_0 \sim SWC_{N-1}$. In FIG. 5, only the switch circuit $SW_j$ is shown. The structures of the other switch circuits are the same as the structure of the switch circuit $SW_j$, thus, omitting the related description here. The switch circuit $SWC_j$ comprises three switches 50~52. The switch 50 is coupled between the capacitor $C_j$ and the voltage Vr. The switch 51 is coupled between the capacitor $C_j$ and the voltage −Vr. The switch 52 is coupled between the capacitor $C_j$ and the analog input signal $V_{in}$. The switches 50-52 are controlled by the logic unit 21 and not turned on at the same time. Thus, one of the three voltages Vr, −Vr, and $V_{in}$ serves as the DC voltage provided the capacitor $C_j$. The logic unit 21 controls the switches 50 and 51 according to the random sequence q. Thus, in equivalent, the switch circuit $SWC_j$ receives the random signal q·V$_r$, which determines the voltage Vr or −Vr to be provided to the capacitor $C_j$ before the conversion phase.

In FIG. 3, the DC voltage (Vr or −Vr) is provided to the capacitor $C_j$ to be calibrated in the period between the time point T1 and a time point T3, as shown by $\phi_1$, however, without limitation. The DC voltage can be provided to the capacitor $C_j$ in any period which just occurs before the conversion phase occurs (that is before the time point T4).

Figure 6A:
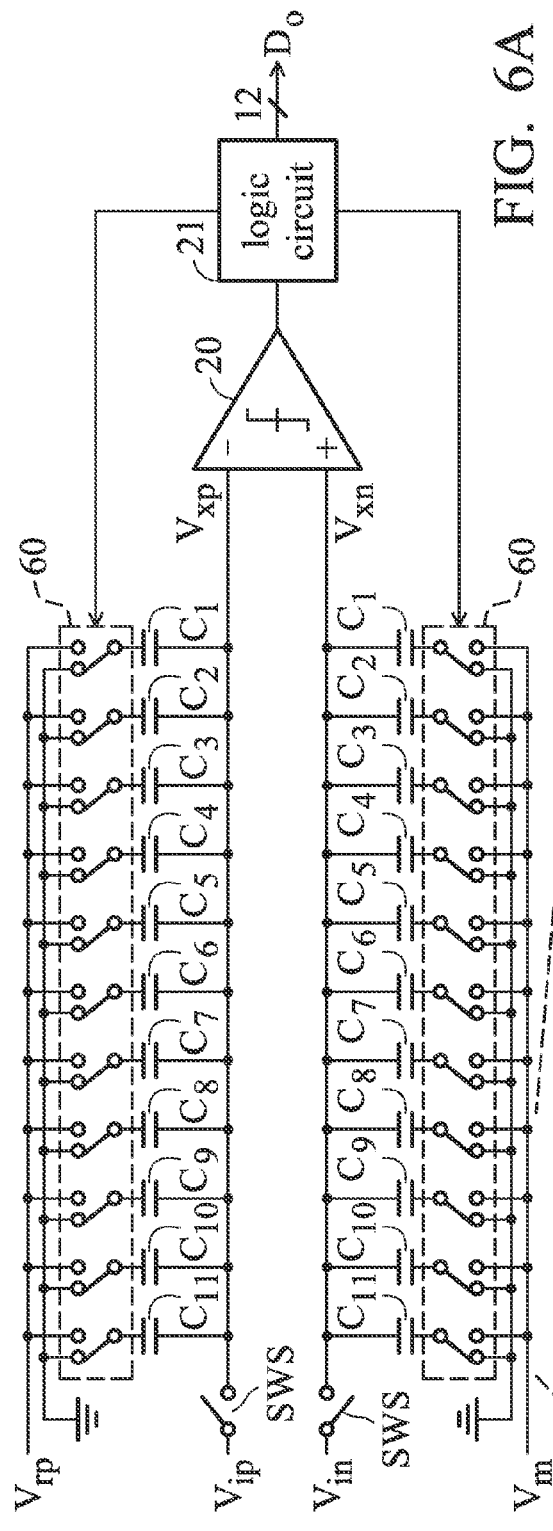
FIGS. 6A and 6B show another exemplary embodiment of an SAR DAC of the SAR ADC circuit in FIG. 1.

FIG. 6A shows another exemplary embodiment of the SAR ADC 10. The SAR ADC shown in FIG. 6A is a differential-type, 12-bit ADC. The signals which are coupled to the sample switches SWS are analog input signals $V_{ip}$ and $V_{in}$. In FIG. 6A, a switch group are coupled to the capacitors $C_1 \sim C_{11}$. The switch group 60 comprises several switches and switch circuits as shown in FIG. 2. Each set of one switch $SW_j$ and one switch circuit $SWC_j$ is coupled to the corresponding capacitor and performs the same operations of the embodiment of FIG. 2. Moreover, $V_{rp}$ replaces the $V_r$ to be provided to capacitors coupled to the positive input (+) of the comparator 20, while $V_{rn}$ replaces the $V_r$ to be provided to capacitors coupled to the negative input (−) of the comparator 20.

Figure 6B:
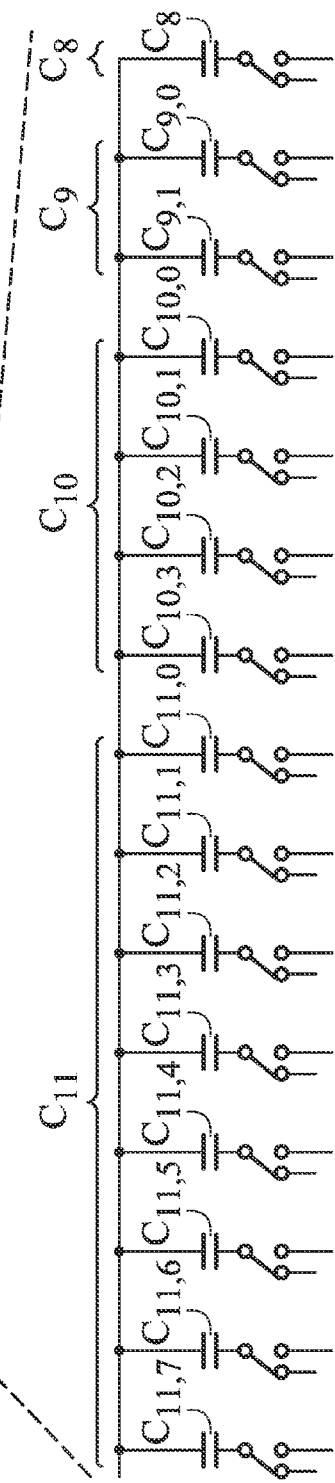

In order to calibrate the weighting values of the capacitors $C_8 \sim C_{11}$, the larger capacitance of the capacitors $C_9 \sim C_{11}$ is divided to small capacitance to relax the lost of dynamic range, as shown in FIG. 6B, that is:

$C_9 = C_{9,1} + C_{9,0}$ $C_{10} = C_{10,3} + C_{10,2} + C_{10,1} + C_{10,0}$ $C_{11} = C_{11,7} + C_{11,6} + C_{11,5} + C_{11,4} + C_{11,3} + C_{11,2} + +C_{11,1} + C_{11,0}$

Thus, the weighting values of the capacitors $C_8$, $C_{9,0} \sim C_{9,1}$, $C_{10,0} \sim C_{10,3}$, and $C_{11,0} \sim C_{11,7}$ are required to be calibrated. The calibration process of the capacitor $C_8$ is the similar to the above process for calibrating the weighting value of the capacitor $C_j$. Thus, before the conversion phase, the charge at the input of the comparator 01 is equal to:

$$Q_{\phi 1} = \sum_{k=1}^{11} C_k \times (V_{ip} - V_{in}) - C_8 \times (V_{ip} - V_{in}) + C_8 \times q \cdot (V_{rp} - V_{rn}) \quad (7)$$

At the end of the conversion phase, the charge at the input of the comparator 20 is given by:

$$Q_{\phi_{SAR}} = -\sum_{k=1}^{11} C_k \times [(V_{xp} - V_{xn}) - b_k(V_{rp} - V_{rn})] \quad (8)$$

According to the charge conservation, $Q_{\phi 1} = Q_{\phi_{SAR}}$, and the voltage at the input of the comparator 20 is expressed as:

$$V_{xp} - V_{xn} = (V_{ip} - V_{in}) - \frac{C_8}{C_{tot}} \times (V_{ip} - V_{in}) + \quad (9)$$

$$\frac{C_8}{C_{tot}} \times q \cdot (V_{rp} - V_{rn}) - \sum_{k=11}^{11} \frac{C_k}{C_{tot}} \times b_k \cdot (V_{rp} - V_{rn})$$

where, $$C_{tot} = \sum_{k=1}^{11} C_k$$

At the end of the conversion phase, ($V_{xp} - V_{xn}$) approaches to zero, and Equation (9) is rewritten as:

$$(V_{ip} - V_{in}) - \frac{C_8}{C_{tot}} \times (V_{ip} - V_{in}) + \frac{C_8}{C_{tot}} \times q \cdot (V_{rp} - V_{rn}) = \quad (10)$$

$$\sum_{k=1}^{11} \frac{C_k}{C_{tot}} \times b_k \cdot (V_{rp} - V_{rn})$$

Figure 7:
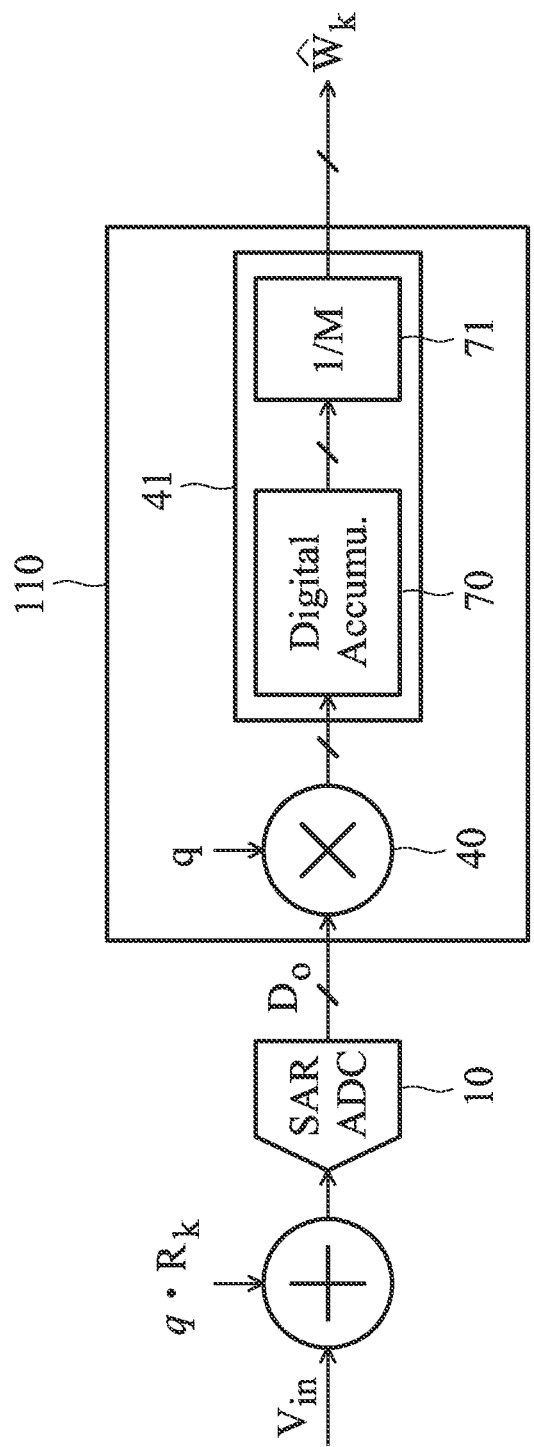
FIG. 7 shows an exemplary embodiment of a low-pass filter.

To extract actual weighting value of the capacitor $C_8$, the digital output signal $D_o$ is correlated with the random q and then low-pass filtered. In the embodiment, the low-pass filtering is achieved by integration and average operations. That is, the digital output signal $D_o$ is further integrated and divided by M cycles. As shown in FIG. 7, in this embodiment the low-pass filter 41 is implemented by a digital accumulator (Digital Accumu.) 70 and a divider (1/M) 71. Thus, we have:

$$\frac{1}{M} \times \sum_{n=0}^{M-1} q \cdot D_O \approx \quad (11)$$

-continued $$\frac{1}{M} \times \sum_{n=0}^{M-1} q \cdot \left[ (V_{ip} - V_{in}) - \frac{C_8}{C_{tot}} \times (V_{ip} - V_{in}) + \frac{C_8}{C_{tot}} \times q \cdot (V_{rp} - V_{rn}) \right]$$

Assume that the random sequence q is uncorrelated with the analog input signal $V_{in}$. The calibrated weighting value of the capacitor $C_8$ is obtained as:

$$\hat{W}_8 \approx \frac{C_8}{C_{tot}} \times (V_{rp} - V_{rn}) \quad (12)$$

While the calibrated weighting value $\hat{W}_8$ is obtained, the digital output signal $D_o$ can be corrected according to the calibrated weighting value $\hat{W}_8$ as:

$$D_{oc} = b_{11} \cdot W_{11} + b_{10} \cdot W_{10} + b_9 \cdot W_9 + b_8 \cdot \hat{W}_8 + \sum_{k=0}^{7} b_k \cdot W_k \quad (13)$$

The above calibration process is also performed to the $C_{9,0} \sim C_{9,1}$, $C_{10,0} \sim C_{10,3}$, and $C_{11,0} \sim C_{11,7}$. The corresponding calibrated weighting values are given by:

$$\hat{W}_9 = \sum_{i=0}^{1} \hat{W}_{9,i} \approx \sum_{i=0}^{1} \frac{C_{9,i}}{C_{tot}} \times (V_{rp} - V_{rn}) \quad (14)$$

$$\hat{W}_{10} = \sum_{i=0}^{3} \hat{W}_{10,i} \approx \sum_{i=0}^{3} \frac{C_{10,i}}{C_{tot}} \times (V_{rp} - V_{rn}) \quad (15)$$

$$\hat{W}_{11} = \sum_{i=0}^{7} \hat{W}_{11,i} \approx \sum_{i=0}^{7} \frac{C_{11,i}}{C_{tot}} \times (V_{rp} - V_{rn}) \quad (16)$$

After the calibration process of the weighting values of $C_8$, $C_{9,0} \sim C_{9,1}$, $C_{10,0} \sim C_{10,3}$, and $C_{11,0} \sim C_{11,7}$, the digital output signal $D_o$ is corrected as:

$$D_{oc} = b_{11} \cdot \hat{W}_{11} + b_{10} \cdot \hat{W}_{10} + b_9 \cdot \hat{W}_9 + b_8 \cdot \hat{W}_8 + \sum_{k=0}^{7} b_k \cdot W_k \quad (17)$$

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A successive approximation register (SAR) analog to digital converter (ADC) circuit receiving an analog input signal and operating in a sample phase and a conversion phase following the sample phase to generate a digital output signal, comprising:

a plurality of capacitors, coupled to a summing node, wherein before the conversion phase, a target capacitor among the plurality of capacitors is coupled to a direct current (DC) voltage and the other capacitors among the plurality of capacitors are coupled to the analog input signal;

a comparator having an input terminal coupled to the summing node, wherein in the conversion phase, the comparator performs a comparison operation to a summing voltage at the summing node; and a logic unit having a plurality of weighting values corresponding to the plurality of capacitors respectively and generating the digital output signal according to the weighting values and a comparison result of the comparison operation, wherein the DC voltage has a first voltage level or a second voltage level different from the first voltage level according to a random sequence, and wherein the weighting value of the target capacitor is calibrated according to the digital output signal and the random sequence.

2. The SAR ADC circuit as claimed in claim 1, wherein the mean of the random sequence is equal to zero.

3. The SAR ADC circuit as claimed in claim 1, further comprising:

an extraction and compensation unit receiving the digital output signal, wherein the extraction and compensation unit performs a correlation operation to the digital output signal with the random sequence and further performs a low-pass-filtering operation to the digital output signal to generate a calibrated weighting value, and wherein the extraction and compensation unit corrects the digital output signal based on the weighting value of the target capacitor.

4. The SAR ADC circuit as claimed in claim 1, wherein the extraction and compensation unit comprises:

a multiplier receiving the digital output signal and performing the correlation operation to the digital output signal and the random sequence; and a low-pass filter, coupled to the multiplier and performing the low-pass-filtering operation to generate the calibrated weighting value.

5. The SAR ADC circuit as claimed in claim 1, wherein the low-pass filter is implemented by a digital accumulator and a divider which operate by predetermined cycles to generate the calibrated weighting value.

6. The SAR ADC circuit as claimed in claim 1, wherein the random sequence is uncorrelated with the analog input signal.

7. A successive approximation register (SAR) analog to digital converter (ADC) circuit receiving an analog input signal and operating in a sample phase and a conversion phase following the sample phase to generate a digital output signal, comprising:

a first switch coupled between a first voltage and a summing node;

a plurality of capacitors each having a first terminal coupled to the summing node and further having a second terminal;

a plurality of second switches, wherein each second switch is coupled between the second terminal of one of the plurality of capacitors and a second voltage;

a plurality of switch circuits receiving the analog input signal, wherein each switch circuits is coupled to the second terminal of one of the plurality of capacitors and, before the conversion phase, provides a DC voltage or the analog input signal to the corresponding capacitor;

a comparator having an input terminal coupled to the summing node, wherein in the conversion phase, the comparator performs a comparison operation to a summing voltage at the summing node;

a logic unit having a plurality of weighting values corresponding to the plurality of capacitors respectively and generating the digital output signal according to the weighting values and a comparison result of the comparison operation; and an extraction and compensation unit receiving the digital output signal, wherein when a target capacitor among the plurality of switch circuits receive the DC voltage from the corresponding switch circuit, the DC voltage has a first voltage level or a second voltage level different from the first voltage level based on a random sequence, and wherein the extraction and compensation unit obtains a calibrated weighting value according to the digital output signal and the random sequence, and the calibrated weighting value serves as the weighting value of the target capacitor.

8. The SAR ADC circuit as claimed in claim 7, wherein the mean of the random sequence is equal to zero.

9. The SAR ADC circuit as claimed in claim 7, wherein the extraction and compensation unit performs a correlation operation to the digital output signal with the random sequence and further performs a low-pass-filtering operation to the digital output signal to generate a calibrated weighting value, and wherein the extraction and compensation unit corrects the digital output signal based on the weighting value of the target capacitor.

10. The SAR ADC circuit as claimed in claim 7, wherein the extraction and compensation unit comprises:

a multiplier receiving the digital output signal and performing the correlation operation to the digital output signal and the random sequence; and a low-pass filter, coupled to the multiplier and performing the low-pass-filtering operation to generate the calibrated weighting value.

11. The SAR ADC circuit as claimed in claim 7, wherein the low-pass filter is implemented by a digital accumulator and a divider which operate by predetermined cycles to generate the calibrated weighting value.

12. The SAR ADC circuit as claimed in claim 7, wherein the random sequence is uncorrelated with the analog input signal.

13. The SAR ADC circuit as claimed in claim 7, wherein each switch circuit comprises:

a third switch coupled between the second terminal of the corresponding capacitor and the analog input signal;

a fourth switch coupled between the second terminal of the corresponding capacitor and a voltage with the first voltage level; and a fifth switch coupled between the second terminal of the corresponding capacitor and a voltage with the second voltage level, wherein the third switch, the fourth switch, and the fifth switch are not turned on at the same time.

14. The SAR ADC circuit as claimed in claim 13, wherein the logic circuit controls the third switch, the fourth switch, and the fifth switch according to whether the weighting value of the corresponding capacitor is to be calibrated.

15. The SAR ADC circuit as claimed in claim 14, wherein when the weighting value of the corresponding capacitor is to be calibrated, the logic circuit controls the fourth switch and the fifth switch according to the random sequence.

16. The SAR ADC circuit as claimed in claim 13, wherein a polarity of the voltage with the first voltage level is inverse to a polarity of the voltage with the second voltage level.

* * * * *